(12) United States Patent
Shimomura et al.

(10) Patent No.: US 7,247,527 B2
(45) Date of Patent: Jul. 24, 2007

(54) METHOD FOR MANUFACTURING SEMICONDUCTOR DEVICE, AND LASER IRRADIATION APPARATUS

(75) Inventors: Akihisa Shimomura, Kanagawa (JP); Masaki Koyama, Kanagawa (JP); Hironobu Shoji, Tokyo (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 251 days.

(21) Appl. No.: 10/900,463

(22) Filed: Jul. 28, 2004

(65) Prior Publication Data

US 2005/0026401 A1 Feb. 3, 2005

(30) Foreign Application Priority Data

Jul. 31, 2003 (JP) ............................. 2003-284462

(51) Int. Cl.
*H01L 21/00* (2006.01)
*H01L 21/84* (2006.01)
(52) U.S. Cl. ............... 438/149; 438/487; 257/E21.133; 257/E21.134; 257/E21.413; 257/E21.703
(58) Field of Classification Search ................ 438/149, 438/487; 257/E21.133, E21.134, E21.413, 257/E21.703
See application file for complete search history.

(56) References Cited

U.S. PATENT DOCUMENTS

| | | | |
|---|---|---|---|
| 5,543,352 A | 8/1996 | Ohtani et al. | |
| 5,569,610 A | 10/1996 | Zhang et al. | |
| 5,612,250 A | 3/1997 | Ohtani et al. | |
| 5,621,224 A | 4/1997 | Yamazaki et al. | |
| 5,712,191 A | 1/1998 | Nakajima et al. | |
| 5,756,364 A | 5/1998 | Tanaka et al. | |

(Continued)

FOREIGN PATENT DOCUMENTS

JP  07-161634  6/1995

(Continued)

OTHER PUBLICATIONS

Y. Nakata, et al., "Crystallization of an a-Si Film by a Nd:YAG Pulse Laser Beam With Linear Polarization", (Japan Advanced Institute of Science and Technology), TFT3-3, AM-LCD 2000, pp. 265-268, Jul. 12-14, 2000.

(Continued)

*Primary Examiner*—Fernando L. Toledo
(74) *Attorney, Agent, or Firm*—Nixon Peabody LLP; Jeffrey L. Costellia

(57) ABSTRACT

It is an object of the present invention to provide a method for manufacturing a crystalline semiconductor film comprising the steps of crystallizing with the use of the metal element for promoting the crystallization to control the orientation and irradiating the laser once to form a crystalline semiconductor film having a small crystal grain arranged in a grid pattern at a regular interval.

In the present invention made in view of the above object, a ridge forms a grid pattern on a surface of the crystalline semiconductor film in such a way that a crystalline semiconductor film is formed by adding the metal element for promoting the crystallization to the amorphous semiconductor film and the pulsed laser whose polarization direction is controlled is irradiated thereto. As the means for controlling the polarization direction, a half-wave plate or a mirror is used.

20 Claims, 9 Drawing Sheets

U.S. PATENT DOCUMENTS

| | | | |
|---|---|---|---|
| 5,795,795 A | 8/1998 | Kousai et al. |
| 5,824,573 A | 10/1998 | Zhang et al. |
| 5,858,823 A | 1/1999 | Yamazaki et al. |
| 5,879,977 A | 3/1999 | Zhang et al. |
| 6,110,770 A | 8/2000 | Zhang et al. |
| 6,143,661 A | 11/2000 | Kousai et al. |
| 6,190,949 B1 | 2/2001 | Noguchi et al. |
| 6,232,156 B1 | 5/2001 | Ohtani et al. |
| 6,319,761 B1 | 11/2001 | Zhang et al. |
| 6,331,457 B1 | 12/2001 | Yamazaki et al. |
| 6,335,541 B1 | 1/2002 | Ohtani et al. |
| 6,451,638 B1 | 9/2002 | Zhang et al. |
| 6,479,329 B2 | 11/2002 | Nakajima et al. |
| 6,548,830 B1 | 4/2003 | Noguchi et al. |
| 6,828,179 B2 | 12/2004 | Yamazaki et al. |
| 6,890,840 B2 | 5/2005 | Isobe et al. |
| 2003/0122129 A1 | 7/2003 | Yamazaki et al. |
| 2003/0143375 A1 | 7/2003 | Noguchi et al. |
| 2004/0259389 A1 | 12/2004 | Yamazaki et al. |
| 2004/0266147 A1 | 12/2004 | Shimomura et al. |
| 2004/0266223 A1 | 12/2004 | Tunaka et al. |
| 2005/0023531 A1 | 2/2005 | Shoji et al. |
| 2005/0208710 A1 | 9/2005 | Isobe et al. |

FOREIGN PATENT DOCUMENTS

| | | |
|---|---|---|
| JP | 10-41234 | 2/1998 |
| JP | 2001-223219 | 8/2001 |
| JP | 2002-203789 | 7/2002 |

OTHER PUBLICATIONS

U.S. Appl. No. 10/887,509, filed Jul. 9, 2004 "Semiconductor Device and Method for Manufacturing Semiconductor Device" (Filing Receipt, Specification, Claims, Drawings).

U.S. Appl. No. 10/878,388, filed Jun. 29, 2004 "Method for Manufacturing a Thin Film Transistor and Method for Manufacturing a Semiconductor Device" (Filing Receipt, Specification, Claims, Drawings).

Oron, M., et al. "*New Experimental Evidence of the Periodic Surface Structure in Laser Annealing*", Applied Physics Letter, vol. 35, No. 10, pp. 782-784 (Nov. 15, 1979).

Fauchet, P., et al. "*Surface Ripples on Silicon and Gallium Arsenide Under Picosecond Laser Illumination*", Applied Physics Letters, vol. 40, No. 9, pp. 824-826, (May 1, 1982).

500

Direction in which the current flows

Direction in which the current flows

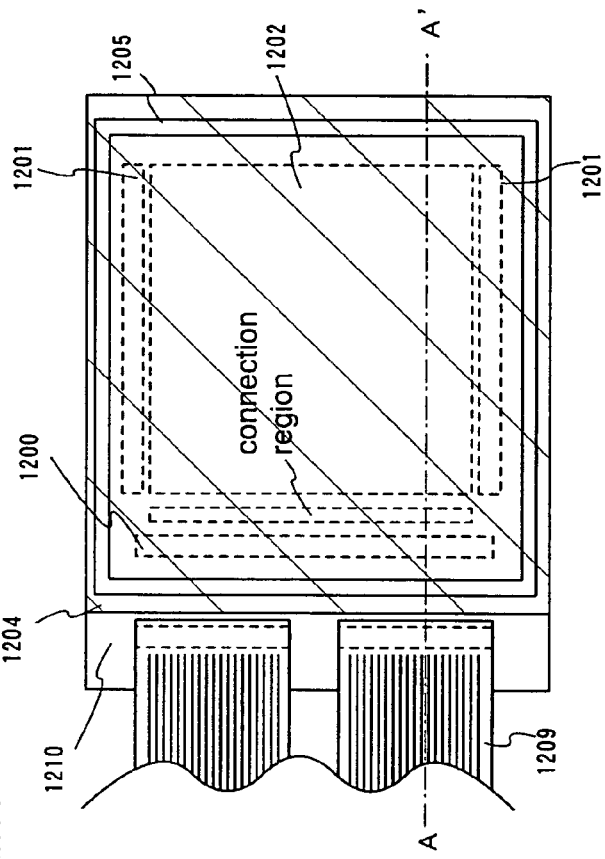
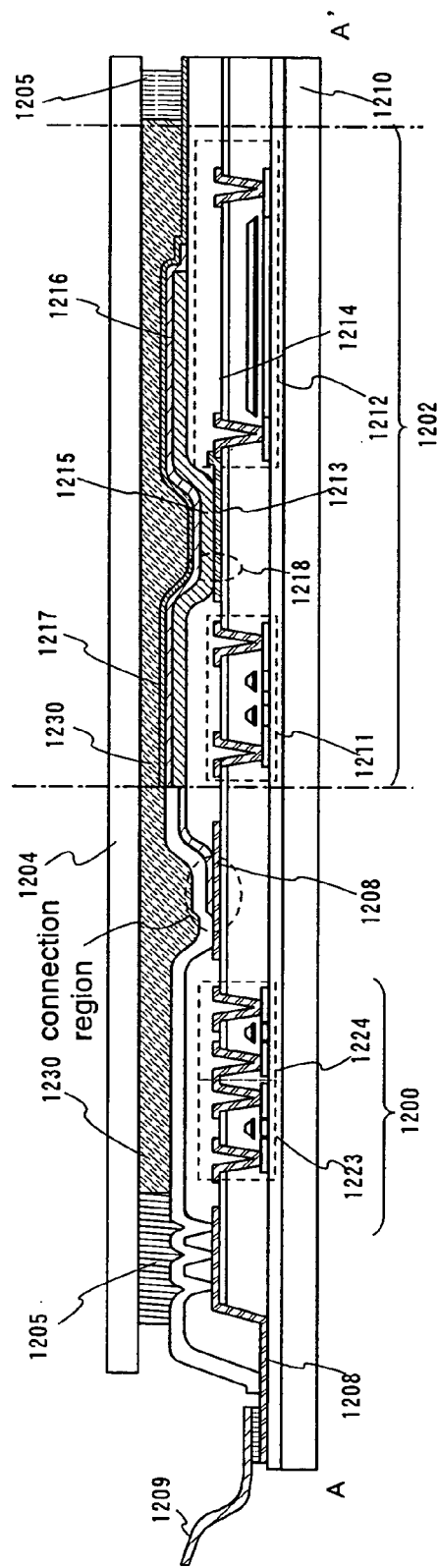
FIG.7A
FIG.7B

METHOD FOR MANUFACTURING SEMICONDUCTOR DEVICE, AND LASER IRRADIATION APPARATUS

BACKGROUND OF THE INVENTION

1. Field of the Invention

The present invention relates to a crystalline semiconductor film having high crystallinity, to a thin film transistor having the crystalline semiconductor film, and to a semiconductor device having the thin film transistor. The present invention also relates to a crystallizing method for manufacturing the crystalline semiconductor film, the thin film transistor, and the semiconductor device. Furthermore, the present invention relates to a laser irradiation apparatus for providing the crystallizing method.

2. Related Art

Recently, a research has been advanced concerning a sophisticated semiconductor device using a thin film transistor. Particularly in the semiconductor device requiring rapidity and high functionality, it is necessary to obtain a thin film transistor (hereinafter also referred to as TFT) having high mobility.

In order to enhance the crystallinity of the semiconductor film, the crystallization is performed to form a crystalline semiconductor film in such a way that a metal element for promoting the crystallization typified by nickel element (Ni) is added, formed, or coated to the semiconductor film, and then a heat treatment is performed thereto (for example, patent document 1 is referred to).

When the metal element for promoting the crystallization typified by Ni is used in such a crystallizing step, it is possible to obtain the crystalline semiconductor film having a large grain size and to obtain the crystalline semiconductor film in which the grain boundaries are likely to unite, thereby having fewer defects in the grain.

In addition, as the different crystallizing method from the heat treatment, a crystallizing method by a laser irradiation has been studied. The crystallization by the laser irradiation is conventionally performed in such a way that an ultraviolet beam is irradiated in a pulse oscillation to an amorphous or poly-crystalline silicon layer to form a silicon thin film including a group of silicon single crystal grains (patent document 2 is referred to, for example). In the laser crystallization according to the patent document 2, the travel distance of a rectangular ultraviolet beam between the position where it ends to be irradiated and the position where it begins to be irradiated next is set to 40 μm or less and the proportion of the travel distance with respect to the width of the ultraviolet beam measured along the moving direction is set in the range of 0.1 to 5%. The patent document 2 discloses that the silicon single crystal grain to be obtained has the preferred orientation approximately <100> to the surface of the base substance.

It is reported that when the polarized laser light is used in the crystallization, what is called a ridge is formed in the direction perpendicular to the polarization direction by optimizing the condition in the laser irradiation (non-patent document 1 is referred to). The non-patent document 1 describes that the interval between the ridges depends on the wavelength and the irradiation angle of the laser light, which is expressed with $\lambda/(1\pm\sin\theta)$ in p-polarized laser light where $\lambda$ is the wavelength of the laser light and $\theta$ is the irradiation angle of the laser light.

In particular, the non-patent document 1 discloses in FIG. 2A that the first irradiation of the linear pulsed laser forms a linear ridge. Moreover, the non-patent document 1 discloses in FIG. 2B that the second irradiation of the linear pulsed laser light at an angle 90° with respect to the direction of the first laser irradiation forms a grid pattern of the ridge.

The non-patent document 1 reports an experiment where an amorphous silicon film formed over a glass substrate is irradiated with a pulsed Nd: YAG laser in a film-forming chamber of ultra high vacuum in which the temperature is set to be the same as that of the substrate, which is 350° C.

[Patent Document 1]
Unexamined Patent Publication H7-161634 bulletin

[Patent Document 2]
Unexamined Patent Publication H10-41234 bulletin

[Non-patent Document 1]
Written by Y. Nakata, A. Shimoyama, and S. Horita, "AM-LCD 2000", p. 265–268

In the crystallizing method according to patent document 1, many aggregations of pillar crystals (each aggregation is also referred to as a domain) having a large size from 200 to 300 μm are formed. The crystals in one domain have the same crystal orientation. However, the orientation is different in the adjacent domains, and they have a boundary therebetween. When a TFT is manufactured by forming a channel-forming region within one domain, high electrical characteristic can be obtained.

However, the domain is formed at random and it is difficult to manufacture TFT so that the channel-forming region is formed within one domain. Therefore, it becomes difficult to form all the channel-forming regions which are arranged in a pixel portion and a driver circuit portion respectively within one domain.

As a result, although there is an advantage of high mobility when such a crystalline semiconductor film is used as an active layer of a TFT (an island-shaped semiconductor film including a channel-forming region and an impurity region), there is a risk of a small difference, which is the variation, in the characteristic between respective TFTs due to the absence or presence of the boundary between the adjacent domains (the domains having the different orientation) in the channel-forming region or due to the difference of the size of the domain to be formed.

The variation in the electrical characteristic of TFT arranged in the pixel portion or the driver circuit portion causes the variation in the current and the voltage applied to each pixel electrode, which becomes the display unevenness that is visible for the observer.

At present, this variation is acceptable and it does not lead to any problems. In the future, however, when the pixel size is miniaturized further and the more precise image is demanded, this variation is considered to become a serious problem. In the future, as the width of the gate metal becomes narrower, the size of the channel-forming region (channel width) becomes smaller. Therefore, there is a risk that a TFT having a boundary between the domains in the channel-forming region is formed. The characteristic of such a TFT (mobility, S-value, on-current, off-current, and the like) varies compared with that of a TFT having a channel-forming region without any boundaries therein, and therefore this variation is considered to cause the display unevenness.

According to the crystallizing method disclosed in the patent document 2, the travel distance of a rectangular ultraviolet beam from the position where it ends to be irradiated to the position where it begins to be irradiated next is set to 40 μm or less, and the proportion of the travel distance with respect to the width of the ultraviolet beam measured along the moving direction is set in the range of 0.1 to 5%. In the embodiment 1 of the patent document 2, any point in the amorphous silicon layer is irradiated by the pulsed ultraviolet beam 100 times.

In such a crystallizing method, the process takes much time because the laser is irradiated to the silicon layer many times, for example 100 times.

In particular, when the crystalline semiconductor film formed by controlling the orientation with the use of a metal such as Ni is irradiated by the laser many times, it is impossible to maintain its orientation. In other words, when the laser light is irradiated many times under the conditions described in the patent document 2 after forming the crystalline semiconductor film with the orientation controlled using the metal element as shown in the patent document 1, it is impossible to maintain the crystalline semiconductor film with the orientation controlled.

In addition, as shown in the non-patent document 1, the ridge forms a grid pattern only when the second laser irradiation is performed at an angle 90° with respect to the direction of the first laser irradiation under the conditions where the Nd: YAG laser is irradiated in a vacuum film-forming chamber with the substrate temperature set to 350° C. Therefore, in such a method, the laser irradiation takes much time. This means it takes much time to manufacture a semiconductor device or a thin film transistor, and therefore this method is unsuitable for mass production.

SUMMARY OF THE INVENTION

The present invention is made in view of the above problems, and it is an object of the present invention to provide a method for manufacturing a crystalline semiconductor film comprising the steps of crystallizing a semiconductor film using a metal contain material for promoting the crystallization while controlling an orientation, and irradiating a laser once so as to form a crystalline semiconductor film having small crystal grains in a grid pattern at regular intervals. And it is also an object of the present invention to provide a crystalline semiconductor film manufactured by the above method. Moreover, it is also an object of the present invention to provide a thin film transistor having the crystalline semiconductor film, to provide a semiconductor device having the thin film transistor, and to provide a method for manufacturing the thin film transistor and the semiconductor device.

In the present invention made in view of the above problems, a ridge forms a grid pattern in such a way that a metal element for promoting the crystallization (hereinafter also referred to as a metal element simply) is added to an amorphous semiconductor film to form a crystalline semiconductor film and then a laser of pulse oscillation (hereinafter referred to as a pulsed laser) whose polarization direction is controlled is irradiated to the crystalline semiconductor film. It is noted that the term "ridge" herein used means a convex portion, which is an uplifted portion of the film formed irregularly in the position where the crystal grains collide. For example, as shown in a SEM image of FIG. 5, the ridge is formed in the position where the crystal grains collide.

The ridge is formed in the crystal grain boundary, and that the ridge forms a grid pattern on the surface of the crystalline semiconductor film means that the crystal grain of the crystalline semiconductor film is formed in a grid pattern. Furthermore, that the ridge forms a grid pattern means that the ridge forms a grid pattern in the most part of the region where particularly the thin film transistor is formed and it is not necessary for the ridge to form a grid pattern in the whole crystalline semiconductor film.

Particularly, in the present invention, the interval between the ridges is almost equal to the emission wavelength of the pulsed laser light irradiated to the crystalline semiconductor film. And the interval between the ridges is controlled by the wavelength of the pulsed laser. Moreover, the interval between the ridges may be controlled by the incidence angle θ of the pulsed laser irradiated to the crystalline semiconductor film.

In addition, the ridge can form a grid pattern by irradiating the pulsed laser once. It is noted that irradiating the pulsed laser once means scanning the pulsed laser once to the crystalline semiconductor film to be the irradiated object, and any point in the crystalline semiconductor film (any irradiated point) is irradiated by the pulsed laser for a plurality of shots.

Particularly in the present invention, the pulsed laser is irradiated under the conditions where the energy and the number of shots are determined so as to maintain the orientation of the crystalline semiconductor film formed by adding the metal element. For example, when the semiconductor film has a thickness of approximately 50 nm, the pulsed excimer laser is irradiated under the conditions where the energy density is set in the range of 350 to 450 mJ/cm$^2$ and the number of shots is set in the range of 20 to 40.

In the present invention, the pulsed laser is preferably shaped into linear using the optical system. The term "linear" herein used does not mean a line strictly but means a rectangle (or an oblong) having a large aspect ratio. The rectangular shape having an aspect ratio of 2 or more (preferably in the range of 10 to 10000) is referred to as linear though the linear is still included in the rectangular. As a result, a large area can be irradiated, thereby enhancing the mass productivity.

The pulsed laser may be incident into the amorphous semiconductor film obliquely at an incidence angle θ. It is noted that the incidence angle θ is set so as to satisfy the inequality of $0°<θ<90°$, preferably the inequality of $20°≦θ≦45°$. For example, when the incidence angle θ is 30°, the interval between the ridges in one direction (the direction in which the pulsed laser is incident obliquely) is twice as long as the wavelength of the pulsed laser.

A laser irradiation apparatus according to the present invention comprises at least a pulsed laser resonator, means for controlling a polarization direction of a pulsed laser, a stage for fixing an amorphous semiconductor film to be an irradiated object, and moving means for moving the amorphous semiconductor film and the pulsed laser relatively. In addition, the laser irradiation apparatus of the present invention preferably has an optical system for shaping the pulsed laser into linear. More preferably, the laser irradiation apparatus of the present invention has means for controlling so that the pulsed laser is irradiated obliquely to the amorphous semiconductor film.

As the means for controlling the polarization direction of the pulsed laser, a half-wave plate or a mirror can be used. As the moving means for moving the stage and the pulsed laser relatively, a uniaxial robot for X axis and a uniaxial robot for Y axis can be used. As the optical system for shaping the pulsed laser into linear, an optical lens such as a cylindrical lens, a concave lens, a convex lens, or the like can be used. In order to irradiate the pulsed laser obliquely to the amorphous semiconductor film, the stage may be tilted.

It is noted one kind or plural kinds selected from the group consisting of nickel (Ni), iron (Fe), cobalt (Co), palladium (Pd), platinum (Pt), copper (Cu), gold (Au), silver (Ag), indium (In), and tin (Sn) can be used in the present invention.

As the pulsed laser in the present invention, one or plural lasers selected from the group consisting of an Ar laser, a Kr laser, an excimer laser, a YAG laser, a $Y_2O_3$ laser, a $YVO_4$ laser, a YLF laser, a $YAlO_3$ laser, a glass laser, a ruby laser, an alexandrite laser, a Ti: Sapphire laser, a copper vapor laser, and a gold vapor laser can be used.

For example, when a YLF laser having an emission wavelength of 527 nm is used, the crystalline semiconductor film in which a crystal grain formed in a grid pattern has a length of approximately 527 nm can be obtained. In addition, when the second harmonic (emission wavelength of 532 nm) of a Nd: YAG laser is used, the crystalline semiconductor film in which a crystal grain formed in a grid pattern has a length of approximately 532 nm can be obtained.

It is noted that either an internal oscillation resonator or an external oscillation resonator can be used in the present invention.

In the case of crystallizing with the use of the metal element for promoting the crystallization as in the present invention, when the metal element adversely affects the electrical characteristic of TFT, it is necessary to remove or reduce the metal element. In removing or reducing the metal element, gettering process is used.

In the present invention, the laser irradiation segregates the metal element typified by Ni in the ridge. Therefore, when the gettering is performed, the metal element can be gettered efficiently in the gettering sink. In particular, the gettering is preferably performed in such a way that after the laser irradiation, the semiconductor film with the noble gas added is formed as the gettering sink on the crystalline semiconductor film where the ridge is formed. In other words, since all the metal elements typified by Ni segregate in the ridge, which is the tip of the crystalline semiconductor film, the gettering efficiency can be increased by forming the gettering sink in the closest position to the ridge. Alternatively, a predetermined region in the crystalline semiconductor film may be used as the gettering sink. For example, the metal element may be reduced or removed in the region to become the channel regions by using the impurity regions to become source regions or drain regions as the gettering sinks.

When the crystalline semiconductor film is formed as shown in the present invention, the metal element segregates in the ridge forming a grid pattern, for example in the tip of the ridge. The gettering step can be also performed by removing the ridge using hydrofluoric acid or the like. In that case, it is not necessary to form the gettering sink.

The crystalline semiconductor film thus formed can be used to manufacture a thin film transistor, and a semiconductor device having the thin film transistor at least in the pixel portion or in the driver circuit portion.

[Advantages Effect of the Invention]

The present invention can provide a crystalline semiconductor film in which the interval between the ridges, which is the size of the crystal grain, is controlled by irradiating once the pulsed laser whose polarization direction is controlled. Moreover, the orientation can be controlled by using the metal element for promoting the crystallization.

When such a crystalline semiconductor film is used to form the thin film transistor, it is possible to manufacture the thin film transistor having uniform electrical characteristic. In addition, the mobility of the thin film transistor can be enhanced by forming the channel-forming region so that the direction in which the current flows conforms to the direction in which the crystal grain is arranged.

Moreover, the interval between the ridges, which is the size of the crystal grain, is almost equal to the wavelength of the laser light to be irradiated, and it is extremely short. Therefore, since the channel-forming region has a plurality of crystal grains, it is possible to decrease the adverse affect in the crystal grain boundary and to reduce the variation in the electrical characteristic of TFT compared to the case where the number of crystal grains is small.

DETAILED DESCRIPTION OF THE INVENTION

Embodiment modes and embodiments of the present invention are hereinafter explained based on drawings. However, since the present invention can be embodied in many different modes, it is easily understood by those skilled in the art that the modes and the details of the present invention can be changed and modified in various ways unless such changes and modifications depart from the scope and the content of the present invention hereinafter defined. Thus, the present invention is not limited to the description of the embodiment modes. In addition, the same reference numeral is given to the same part or the part having the similar function throughout the drawings for explaining the embodiment modes and the embodiments. And the explanation to such a part shall not be repeated.

BRIEF DESCRIPTION OF THE DRAWINGS

In the accompanying drawings:

FIGS. 7A and 7B are drawings which show a light-emitting device of the present invention;

EMBODIMENT MODES (Embodiment Mode 1)

The present embodiment mode explains a method for manufacturing a crystalline semiconductor film in detail.

Figure 1A:
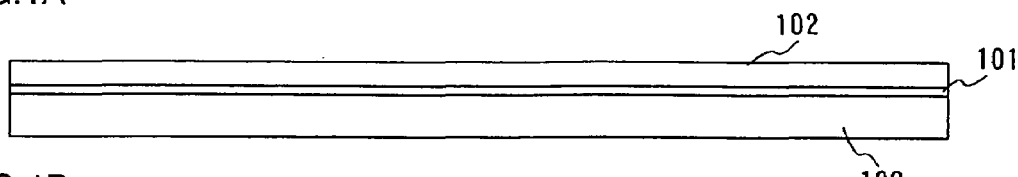
FIGS. 1A to 1F are cross-sectional views which show a method for manufacturing a crystalline semiconductor film of the present invention.

Initially, as shown in FIG. 1A, a base film 101 is formed on a substrate 100 having an insulating surface. A glass substrate such as a barium borosilicate glass or an alumino borosilicate glass, a quartz substrate, or an SUS substrate can be used as the substrate 100 for example. In addition, although a substrate made of flexible synthetic resin such as acryl or plastic typified by PET, PES, PEN, or the like tends to be inferior in resistance against the heat to the other substrates, the substrate made of flexible synthetic resin can be used when it can resist the heat generated in the manufacturing process.

The base film 101 is provided in order to prevent that alkali-earth metal or alkali metal such as Na included in the substrate 100 diffuses into the semiconductor film to have an adverse affect on a characteristic of a semiconductor device. Therefore, the base film 101 is formed of an insulating film such as silicon oxide, silicon nitride, silicon nitride oxide that can prevent the diffusion of alkali metal or alkali-earth metal into the semiconductor film. In the present embodiment mode, a silicon nitride oxide film is formed in thickness from 10 to 400 nm (preferably from 50 to 300 nm) using a plasma-CVD method. In addition, the base film 101 may have a laminated structure and the base film 101 may be formed by laminating a silicon oxynitride film (composition ratio: Si=32%, O=27%, N=24%, H=17%) in thickness from 10 to 200 nm (preferably, from 50 to 100 nm) and a silicon oxynitride film (composition ratio: Si=32%, O=59%, N=7%, H=2%) in thickness from 50 to 200 nm (preferably from 100 to 150 nm) in order, for example.

In the case of using the substrate including the alkali metal or the alkali-earth metal in any way such as the glass substrate, the SUS substrate, or the plastic substrate, it is effective to provide the base film in terms of preventing the diffusion of the impurity. When the diffusion of the impurity does not lead to any significant problems, for example when the quartz substrate is used, the base film is not always necessary to be provided.

An amorphous semiconductor film 102 is formed on the base film 101. The film thickness of the amorphous semiconductor film 102 is set in the range of 25 to 100 nm (preferably in the range of 30 to 60 nm). In addition, not only silicon but also silicon germanium can be used as the amorphous semiconductor. When silicon germanium is used, the concentration of germanium is preferably in the range of 0.01 to 4.5 atomic %. A silicon-based semiconductor film (also referred to as an amorphous silicon film) having a thickness of 40 nm is used as the amorphous semiconductor film 102 in the present embodiment mode.

Figure 1B:
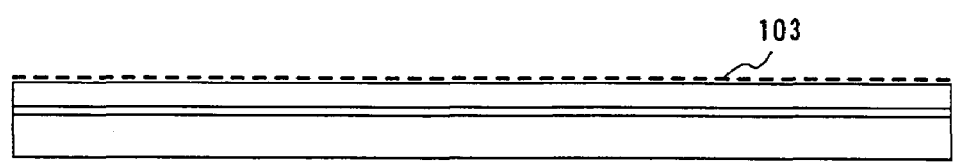

Next, as shown in FIG. 1B, a metal element is added in the amorphous semiconductor film 102. Adding the metal element herein means forming the metal element on the surface of the amorphous semiconductor film 102 so that at least the crystallization is promoted. For example, Ni solution (including aqueous solution and acetic acid medium) is applied on the amorphous semiconductor film 102 by an application method such as a spin coat method or a dip method to form a film 103 including Ni (however, this film is so thin that it may not be observed). On this occasion, in order to improve wettability of the surface of the amorphous semiconductor film 102 and to coat all over the surface thereof with the Ni solution, it is desirable to form an oxide film (not shown diagrammatically) in a thickness from 10 to 50 Å by UV light radiation in the oxygen atmosphere, by a thermal oxidation method, by a process using ozone water including hydroxyl radical or by a process using hydrogen peroxide. Alternatively, Ni can be added to the amorphous semiconductor film in such a way that a Ni ion is injected by an ion implantation process, that the heat treatment is performed in the water vapor atmosphere including Ni, or that the sputtering is performed using Ni material as a target under Ar plasma. In the present embodiment mode, an aqueous solution including Ni acetate by 10 ppm is applied by the spin coat method.

After that, the amorphous semiconductor film 102 is heated at temperatures ranging from 500 to 550° C. for 2 to 20 hours to crystallize the amorphous semiconductor film so that a crystalline semiconductor film is formed. In the heat treatment, it is preferable to change the heating temperature gradually. This is because the initial low-temperature heat treatment can extract hydrogen and the like from the amorphous semiconductor film, thereby reducing the roughness of the film in the crystallization. Alternatively, a magnetic field may be applied to crystallize the semiconductor film in combination with its magnetic energy, or a microwave of high output may be also used. In the present embodiment mode, the heat treatment is performed at a temperature of 550° C. for four hours after a heat treatment at a temperature of 500° C. for one hour using a vertical furnace.

Figure 1C:
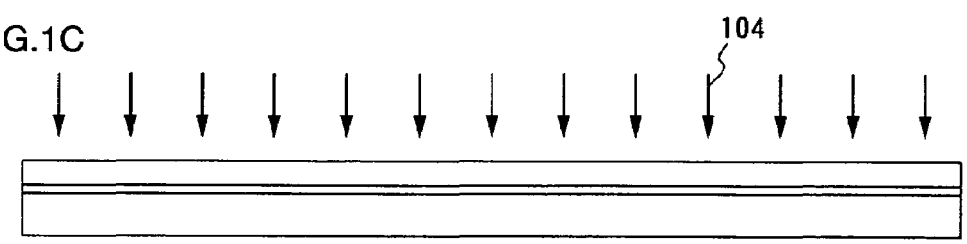

Next, the oxide film formed on the surface of the crystalline semiconductor film is etched away using hydrofluoric acid. Then, after crystallizing the amorphous semiconductor film 102, pulsed laser light 104 is irradiated to the amorphous semiconductor film 102 as shown in FIG. 1C. In the present embodiment mode, a pulsed excimer laser (XeCl, emission wavelength 308 nm) is irradiated under conditions where the energy density is set to 420 mJ/cm² and the number of shots is set to 25. The linear laser here has a size of 400 μm×120 mm.

Figure 1D:
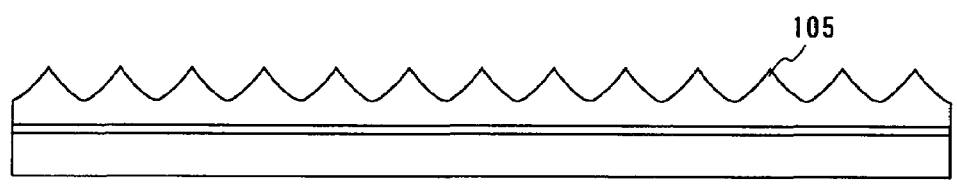

Then, as shown in FIG. 1D, a convex portion 105 referred to as a ridge forms a grid pattern on the surface of the crystalline semiconductor film. The size of the ridge depends upon the conditions in the laser irradiation. Specifically, the size thereof grows as the energy density and the number of shots increase. It is noted that the ridge forms a grid pattern means the crystal grain is formed in a grid pattern. FIG. 1D is a cross-sectional view typically showing the shape of the ridge. Specifically, the ridge forms a grid pattern as shown in a SEM image of FIG. 5, which will be explained in embodiment 1.

In this ridge segregates a metal element for promoting the crystallization. For example, when Ni is used as the metal element to form a crystalline silicon film, nickel silicide ($NiSi_2$, $Ni_3Si_2$, $Ni_2Si$, or the like) segregates in the ridge. As thus described, when nickel silicide segregates in the ridge of the crystalline silicon film, Ni no longer exists outside the ridge, and therefore the metal element typified by Ni can be removed efficiently.

Figure 1E:
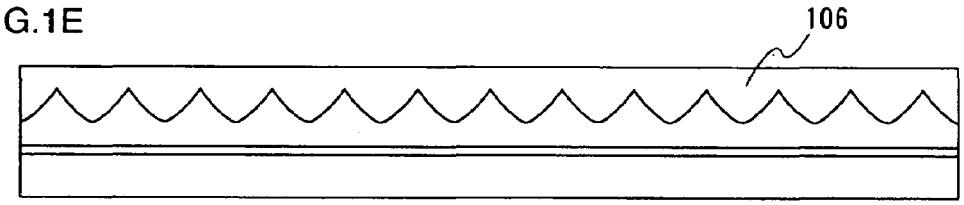

In FIG. 1E, the gettering step is performed in such a way that an amorphous semiconductor film 106 having an inert element such as Ar added is formed on the ridge with the metal element segregated, and then a heat treatment is performed thereto. Alternatively, the gettering step may be performed with the ridge removed therefrom.

The amorphous semiconductor film 106 can be formed by a CVD method or a sputtering method with the use of a target having Si. For example, a high frequency may be applied to the target by operating a high frequency power supply and a magnetic field may be further applied using a permanent magnet in the sputtering apparatus. In addition, an electric power applied to the target (having a size of 12 inch) is set in the range of 0.5 to 3 kW. It is preferable, on this occasion, to heat the substrate 100 at temperatures from a room temperature (25° C.) to 300° C. Then, the amorphous semiconductor film 106 to become the gettering sink is formed. It is more preferable to supply heated Ar gas from above the substrate 100 and to spray it to the surface that is opposite to the surface with the amorphous semiconductor film 106 formed. It is preferable to set the flow rate of the heated Ar gas in the range of 10 to 50 sccm. The processing time needs to be determined in consideration of the deposition condition or the throughput, and it is preferable to set it in the range of 1 to 20 minutes, preferably for approximately 5 minutes.

In the case of forming the amorphous semiconductor film 106 on the semiconductor film, it is preferable to form an oxide film in order to improve wettability and to prevent the film from being peeled. A thin film (chemical oxide) formed by processing with the use of ozone water or an aqueous solution in which sulfuric acid, hydrochloric acid, or nitric acid is mixed with hydrogen peroxide water can be used as the oxide film. Alternatively, the oxidation may be performed by a plasma treatment in the atmosphere including oxygen or by generating ozone through an ultraviolet ray irradiation in the atmosphere including oxygen.

In the present embodiment mode, when the crystalline semiconductor film is irradiated with the laser light as shown in FIG. 1C, an oxide film (not shown diagrammatically) is formed on the surface of the semiconductor film. After that, the amorphous semiconductor film 106 can be formed on the oxide film.

Moreover, the gettering step may be performed in such a way that an impurity element is injected into a part of an impurity region to form a gettering sink, and then a heat treatment is performed thereto.

Since the gettering step is performed after the crystallization by the pulsed laser in the present embodiment mode, the gettering step can be performed after the amorphous condition in the crystalline semiconductor film is reduced. Therefore, the metal element for promoting the crystallization can be gettered in the gettering sink efficiently. It is noted that the crystallization by the pulsed laser may be performed after the gettering step.

Figure 1F:
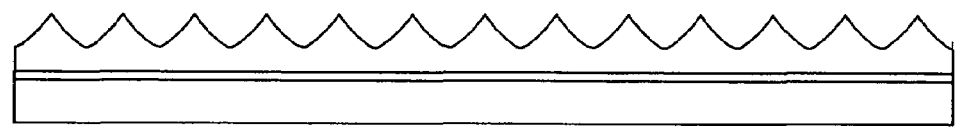

After that, as shown in FIG. 1F, the amorphous semiconductor film 106 is removed by wet etching, dry etching, or by polishing with the use of a CMP (Chemical Mechanical Polishing) method. For example, the amorphous semiconductor film 106 can be removed by wet etching with the use of alkali solution typified by hydrazine or tetramethylammonium hydroxide (TMAH, chemical formula: $(CH_3)_4NOH$)).

Subsequently, the oxide film is removed by wet etching with the use of hydrofluoric acid based etchant. It is preferable that the surface-active agent is included in the hydrofluoric acid based etchant.

In addition, when there is nickel silicide or the like in a channel-forming region, a drain region, or a source region, it becomes a path of current, which causes the increase of the off-current. Therefore, it is important to getter the metal element efficiently in the step of forming the crystalline semiconductor film as the present embodiment mode.

When only the amorphous semiconductor film 106 and the oxide film are removed, the ridge 105 remains. Therefore, a flattening process may be performed to the surface of the crystalline semiconductor film. For example, the flattening process may be performed by polishing the surface of the crystalline semiconductor film according to the CMP method. When the flatness of the surface of the crystalline semiconductor film does not lead to any problems, the flattening process is not necessary. Although the flattening process may have some influence, the crystal grain is still formed in a grid pattern.

In addition, when the ridge 105 is removed, wet etching may be performed using hydrofluoric acid based etchant. It is preferable that surface-active agent is included in the hydrofluoric acid based etchant. In particular, although the crystal grain may be affected by removing the ridge, the crystal grain is still formed in a grid pattern.

When the ridge is removed, a depression (a concave portion) is formed. Therefore, the flattening process is preferably performed to the surface of the crystalline semiconductor film. In this case, the laser light is preferably irradiated in the atmosphere not including oxygen, which means the inert atmosphere. For example, the flattening process is performed by irradiating the pulsed excimer laser (XeCl, emission wavelength 308 nm) in a nitrogen atmosphere and under the conditions where the energy density is set to 480 mJ/cm$^2$ and the number of shots is set to 12. It is noted that the flattening process may be performed to the surface of the crystalline semiconductor film by polishing it using the CMP method. When the flatness of the surface of the crystalline semiconductor film does not lead to any problems, the flattening process is not necessary. It is noted that although the flattening process after removing the ridge may have some influence, the crystal grain are still formed in a grid pattern.

Thus, it is possible to suppress the roughness of the surface on the semiconductor, and to suppress the variation in the threshold due to the variation in the interface state density.

The crystalline semiconductor film thus formed is patterned into a predetermined shape, thereby forming an island-shaped crystalline semiconductor film. After that, a thin film transistor having this crystalline semiconductor film can be formed.

And, a semiconductor device having the thin film transistor can be manufactured. The semiconductor device is, for example, the integrated circuit or the semiconductor display device. The thin film transistor can be used particularly in a pixel portion and in a driver circuit portion of the semiconductor display device such as a liquid crystal display device, a light-emitting device having a light-emitting element, typically an organic light-emitting element, equipped in each pixel, a DMD (Digital Micromirror Device), a PDP (Plasma Display Panel), or an FED (Field Emission Display).

Since the present invention can make the crystal grain small, the present invention is preferable for the thin film transistor having a small channel size such as the thin film transistor of CPU having the integrated circuit.

In addition, the crystalline semiconductor film may be made separately in the pixel portion and in the driver circuit portion in the semiconductor display device. For example, TFT used in the driver circuit portion requires high mobility. Therefore, the mask may be provided so that the metal element for promoting the crystallization is added only to the TFT used in the driver circuit portion and then the laser crystallization may be performed to the pixel portion and the driver circuit portion.

In addition, the crystalline semiconductor film can be made separately even in the pixel portion. For example, the variation in the crystallinity of TFT in the pixel portion, particularly a driver TFT connected to the light-emitting element, leads to the display unevenness. In addition, the ridge formed in the semiconductor film constituting the capacitance element in the pixel portion may cause the leakage current. Therefore, the laser crystallization is performed only to TFT in the pixel portion, particularly to the driver TFT, and the laser crystallization is not performed to the capacitance element by providing a mask.

With the above steps, it is possible to provide a crystalline semiconductor film having a crystal grain formed in a grid pattern. When the thin film transistor is formed using such a crystalline semiconductor film, the thin film transistor has uniform electrical characteristic. Moreover, when the channel-forming region is formed so that the direction in which the direction in which the current flows conforms to the direction in which the crystal grain is arranged more regularly, the mobility of the thin film transistor can be enhanced.

Moreover, the interval between the ridges, which is the size of the crystal grain, is almost equal to the wavelength of the laser light and it is extremely short. Therefore, since the channel-forming region has a plurality of crystal grains, the adverse affect in the crystal grain boundary can be decentralized and relaxed compared to the case where the number of crystal grains is small.

In addition, when the ridge in which the metal element typified by Ni segregates is removed, the gettering can be performed without forming another gettering sink. When the metal element further segregates, the metal element no longer exists outside the ridge, thereby removing the metal element efficiently.

(Embodiment Mode 2)

The present embodiment mode explains a multi-chamber apparatus having a laser irradiation apparatus and an optical system in the laser irradiation apparatus.

Figure 2A:
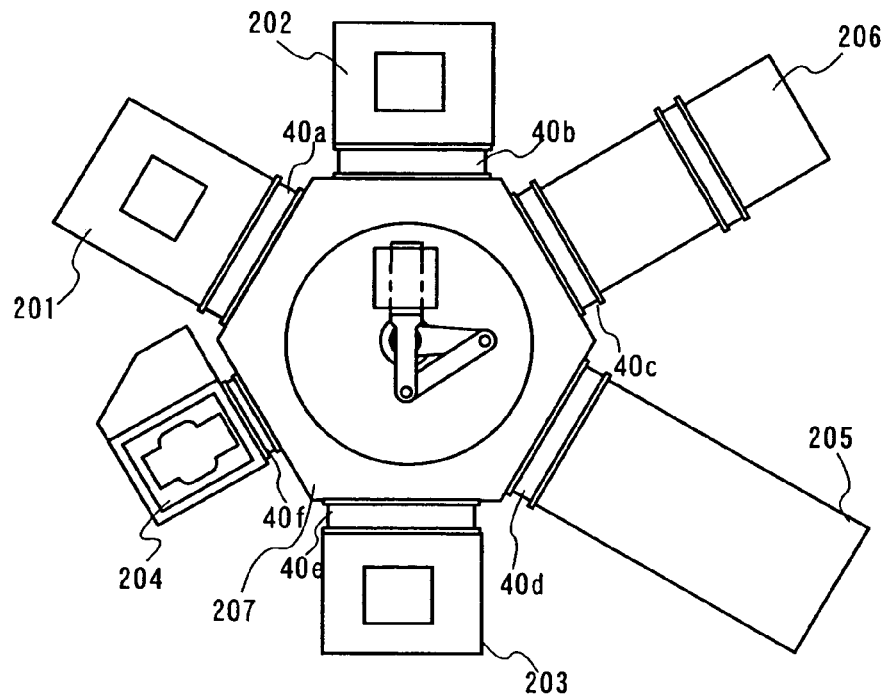
FIGS. 2A and 2B are drawings which show a processing apparatus and a laser irradiation chamber of the present invention.

FIG. 2A shows a multi-chamber apparatus including a first treatment chamber 201 where the processes up to forming an amorphous semiconductor film can be performed, a second treatment chamber 202 where the metal element can be added, a third treatment chamber 203 where a heat treatment can be performed, an unload chamber 204 where a substrate can be unloaded, a laser irradiation chamber 205 where the laser irradiation is performed, and a load chamber 206 where the substrate can be stored, each of which is provided around a transferring chamber 207. Each treatment chamber and the like are connected to the transferring chamber 207 with transferring gates 40a to 40f respectively interposed therebetween. By providing each treatment chamber and the like around the transferring chamber having transferring means, transferring distance and transferring time can be shortened.

The first treatment chamber 201 has, for example, an electrode, a high frequency power supply, a vacuum pump, and a gas supply port to perform a plasma CVD process. The base film and the amorphous semiconductor film can be formed by differing the gas to be supplied.

The second treatment chamber 202 has, for example, a nozzle for applying an aqueous solution including a metal element and means for rotating a substrate.

The third treatment chamber 203 has a system for controlling a heating temperature by which the heating temperature can be raised gradually.

In addition, the atmosphere of each treatment chamber and the laser irradiation chamber can be controlled. For example, the pressure in the chambers can be reduced or the chambers can have the inert atmosphere.

Throughput can be improved by using such a multi-chamber apparatus. Moreover, when a plurality of multi-chamber apparatus like this is employed, the substrate can be processed without interrupting the step even when the maintenance is being done to one of the chambers.

Figure 2B:
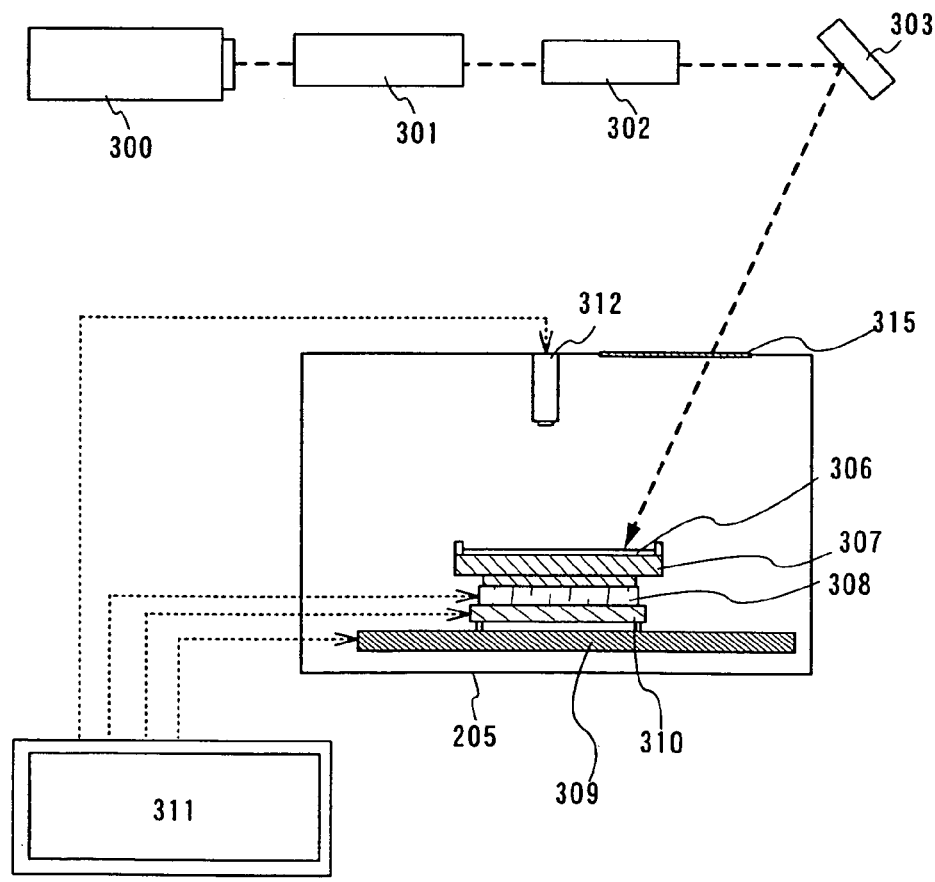

FIG. 2B shows a specific structure of the laser irradiation chamber 205.

Laser light oscillated from a laser resonator 300 is incident into a beam expander 301. The beam expander 301 suppresses the divergence of the incident laser light and adjusts the size of the cross section of the beam.

A cross section of the beam emitted from the beam expander 301 is shaped into rectangular, elliptical, or linear through a cylindrical lens 302.

And, the laser light is reflected by a mirror 303 and condensed into linear, and then it is irradiated to a processing object 306 in the laser irradiation chamber 205.

In other words, the beam expander, the cylindrical lens, and the mirror correspond to one means for shaping the laser light into linear.

On this occasion, the laser irradiation chamber 205 has a window 315 having a half-wave plate by which the pulsed laser is controlled so that the polarization direction is polarized by 90°. The half-wave plate may be inserted wherever on the optical axis of the laser. However, in consideration of the size of the half-wave plate, it is preferably inserted in the position where the beam diameter of the laser is small. For example, the half-wave plate is preferably fixed in the vicinity of the surface of the amorphous semiconductor film to be an irradiation object.

Figure 3:
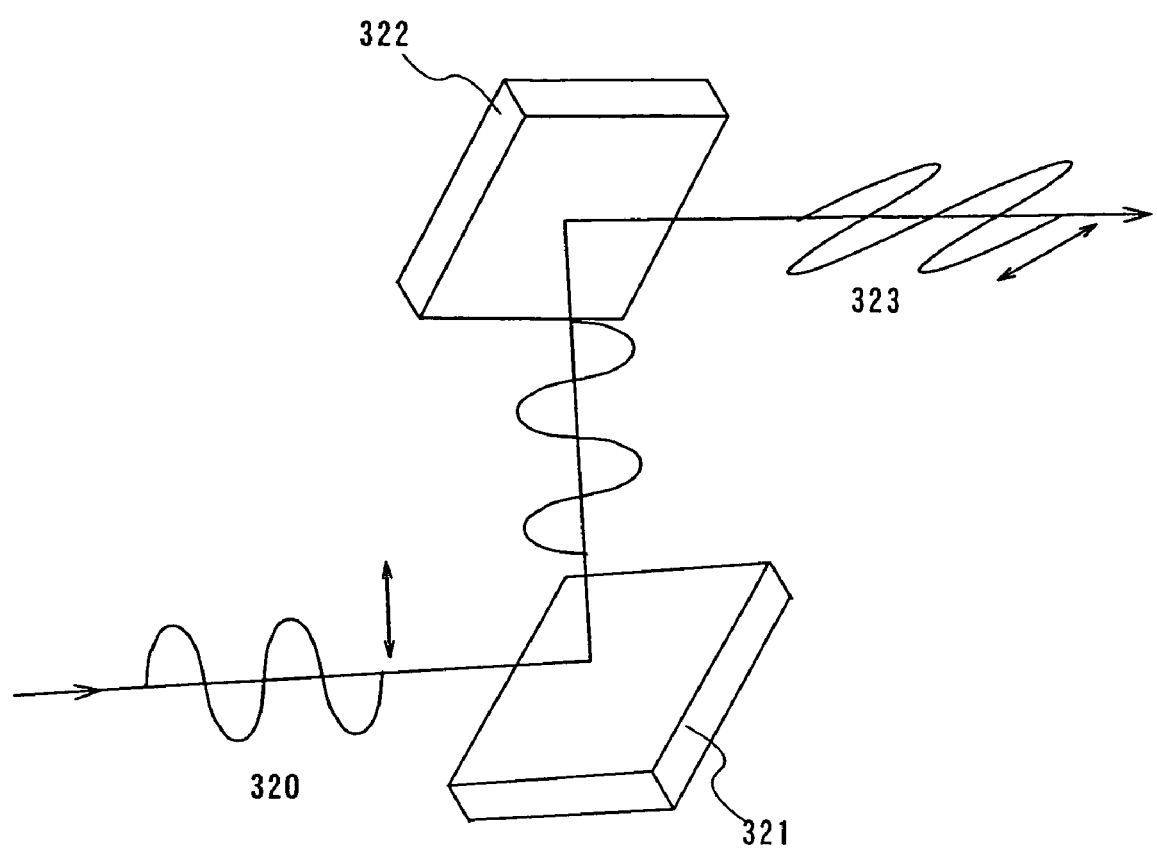
FIG. 3 is a drawing which shows a method for controlling polarization direction of the laser according to the present invention.

In addition, as shown in FIG. 3, a mirror may be used to control the polarization direction of the laser. Specifically, a vertically polarized laser 320 is reflected by a first mirror 321, and then it is further reflected by a second mirror 322. Thus, a horizontally polarized laser 323 can be obtained.

In the laser irradiation chamber 205, a processing object 306 is set on a stage 307, and the position of the stage 307 is controlled by uniaxial robots 308, 309, and 310 which are the position controlling means. Specifically, a uniaxial robot 308 for θ axis can rotate the stage 307 in the horizontal surface. It is noted that the stage with the irradiated object fixed thereon may be tilted to perform the oblique irradiation.

The uniaxial robot 309 for X axis can move the stage 307 in X-axis direction. The uniaxial robot 310 for Y axis can move the stage 307 in Y-axis direction. And, the processing object is scanned in X-axis direction while irradiating the linear beam spot extended long in Y-axis direction. It is a central processing device 311 that controls the operation of each position controlling means. The uniaxial robot for X axis and the uniaxial robot for Y axis correspond to one means for moving the irradiated object and the laser light relatively.

When the pulsed laser is employed, the feed pitch of the substrate per a pulse is preferably set in the range of 1 to 30 μm.

It is noted that a monitor 312 using a photo detector such as CCD may be provided in order to know the exact position of the processing object 306.

By removing the oxide film just before irradiating the laser light, the impurity contamination to the semiconductor film can be reduced.

With such a system of the laser irradiation apparatus, the laser processing based on the exact position control can be performed. Moreover, it is possible to set the stage with the processing object fixed thereon horizontally or on a tilt so as to perform the laser irradiation vertically or obliquely.

(Embodiment Mode 3)

The present embodiment mode explains a light-emitting device as an example of a semiconductor device having a crystalline semiconductor film.

FIG. 7A shows a light-emitting device where a signal line driver circuit 1200, a scanning line driver circuit 1201, and a pixel portion 1202 are formed on a first substrate 1210.

FIG. 7B is a cross-sectional view of the display device taken along A–A' in FIG. 7A, which illustrates the signal line driver circuit 1200 equipped with a CMOS circuit having an n-channel TFT 1223 and a p-channel TFT 1224 on the first substrate 1210. The n-channel TFT 1223 and the p-channel TFT 1224 are formed using the crystalline semiconductor film of high quality obtained by performing the laser annealing with the use of the pulsed laser whose polarization direction is controlled. TFT forming the signal line driver circuit 1200 and the scanning line driver circuit 1201 may be formed by the CMOS circuit, a PMOS circuit, or an NMOS circuit.

The pixel portion 1202 has a switching TFT 1211 and a driver TFT 1212. The switching TFT 1211 and the driver TFT 1212 have the crystalline semiconductor film of high quality obtained by performing the laser annealing with the use of the pulsed laser whose polarization direction is controlled. TFT of the pixel portion 1202 does not need high crystallinity compared to those of the signal line driver circuit 1200 and the scanning line driver circuit 1201. The pixel portion 1202 has an insulator 1214 which covers the first electrode 1213 of the light-emitting element connected to one electrode of the driver TFT 1212; the switching TFT 1211; and the driver TFT 1212, and which has an opening in the position corresponding to the first electrode 1213 of the light-emitting element. The pixel portion 1202 also has a light-emitting element 1218 in which the electroluminescent layer 1215 is provided on the first electrode 1213 and the second electrode 1216 of the light-emitting layer is further provided on the electroluminescent layer 1215. It is noted that the electroluminescent layer is formed of an organic material or an inorganic material, and it is constituted by combining an electron injecting layer, an electron transporting layer, a light emitting layer, a hole transporting layer, a hole injecting layer, and the like appropriately.

The insulator 1214 may be formed of an organic resin film such as resist, polyimide, or acrylic, or may be formed of an inorganic insulating film including silicon such as silicon nitride or silicon oxide. Here, the insulator 1214 is formed of a positive photosensitive acrylic resin film. In the case of using the organic resin film or the like, it is preferable to form an insulating film including silicon nitride or silicon nitride oxide as its main component or to form a DLC (Diamond Like Carbon) film including hydrogen in order to prevent moisture or oxygen from penetrating thereinto.

It is noted that in order to improve the coverage to the step of the electrode or the electroluminescent layer to be formed afterward, it is preferable to form the insulator 1214 having curvature in its upper part or in its lower part. For example, when the insulator 1214 is formed of the positive photosensitive acrylic, it is preferable that only the upper part of the insulator 1214 has radius of curvature (in the range of 0.2 to 3 μm). In addition, either a negative type which becomes insoluble in etchant by the irradiation of the light or a positive type which becomes soluble in etchant by the irradiation of the light can be applied as the insulator 1214.

Since the first electrode 1213 of the light-emitting element contacts the first electrode of the driver TFT 1212, it is desirable that at least the bottom surface of the first electrode 1213 of the light-emitting element is formed of the material having an ohmic contact with the first electrode region of the semiconductor film and that the surface thereof contacting the electroluminescent layer is formed of the material having high work function. For example, the first electrode 1213 of the light-emitting element may be formed of a single layer of a titanium nitride film or may be formed by laminating three or more layers.

Furthermore, when the first electrode 1213 and the second electrode 1216 of the light-emitting element are formed of a light-transmitting conductive film, it is possible to manufacture a light-emitting device of dual emission type.

The first electrode 1213 can be formed of a non-light-transmitting conductive film, preferably the conductive film having high reflectivity, and the second electrode 1216 can be formed of a light-transmitting conductive film. This can manufacture a light-emitting device of a top-emission type in which the light is emitted only to the sealing substrate side.

On the contrary, when the first electrode 1213 is formed of the light-transmitting conductive film and the second electrode 1216 is formed of the non-light-transmitting conductive film, preferably the conductive film having high reflectivity, it is possible to manufacture a light-emitting device of a bottom-emission type in which the light is emitted only to the substrate side.

It is noted that the light can be used efficiently by employing the conductive film having high reflectivity as the electrode of the light-emitting element provided in the side to which the light is not emitted.

It is noted that both of the first electrode and the second electrode can be the anode or the cathode according to the pixel structure. For example, when the first electrode is the anode and when the second electrode is the cathode, the specific electrode material is explained as follows.

It is preferable to use metal, alloy, conductive compound, a mixture of these, or the like having high work function (work function is 4.0 eV or more) as the anode material. More specifically, ITO (indium tin oxide), IZO (indium zinc oxide) including indium oxide which is mixed with tin oxide (ZnO) in the range of 2 to 20%, gold (Au), platinum (Pt), nickel (Ni), tungsten (W), chromium (Cr), molybdenum (Mo), iron (Fe), cobalt (Co), copper (Cu), palladium (Pd), or the metallic nitride material such as TiN can be used as the anode material.

On the other hand, it is desirable to use metal, alloy, conductive compound, a mixture of these, or the like having low work function (work function is 3.8 eV or less) as the cathode material. Specifically, the cathode can be formed of the material such as the element belonging to the first group or the second group in the periodic table, that is to say, alkali metal such as Li or Cs; Mg, Ca, or Sr; alloy including these such as Mg:Ag or Al:Li; a chemical compound such as LiF, CsF, or $CaF_2$; or transition metal including a rare-earth metal. However, when the cathode is light-transmitting, the cathode is formed by forming these metals or the alloy including these metals extremely thinly and by laminating the metal (including alloy) such as ITO.

These anode and cathode can be formed by the vapor deposition method, the sputtering method, or the like.

In addition, when the full-color display is performed, the electroluminescent layer 1215 is formed in such a way that the materials each showing the red (R), the green (G), and the blue (B) emissions are formed selectively by the vapor deposition method with the use of the respective deposition masks or by an ink-jetting method. Specifically, CuPc or PEDOT is employed as HIL (hole injecting layer), α-NPD is employed as HTL (hole transporting layer), BCP or $Alq_3$ is employed as ETL (electron transporting layer), BCP:Li or $CaF_2$ is employed as EIL (electron injecting layer) respectively. In addition, $Alq_3$ doped with dopant in accordance with the respective colors of R, G, and B (DCM or the like in the case of R, DMQD or the like in the case of G) may be employed as EML (emitting layer).

More specific laminated structure of the electroluminescent layer 1215 is explained as follows. In the case of forming the electroluminescent layer showing red color emission, for example, CuPc is formed 30 nm in thickness and then α-NPD is formed 60 nm in thickness. After that, the same mask is used to form Alq$_3$ with DCM$_2$ and rubrene added 40 nm in thickness as a red light-emitting layer, to form BCP 40 nm in thickness as an electron transporting layer, and to form BCP with Li added 1 nm in thickness as an electron injecting layer. In addition, in the case of forming the electroluminescent layer showing green color emission, for example, CuPc is formed 30 nm in thickness and then α-NPD is formed 60 nm in thickness. After that, the same vapor deposition mask is used to form Alq$_3$ with coumarin 545T added 40 nm in thickness as the green light-emitting layer, to form BCP 40 nm in thickness as the electron transporting layer, and to form BCP with Li added 1 nm in thickness as the electron injecting layer. In addition, in the case of forming the electroluminescent layer showing blue color emission, for example, CuPc is formed 30 nm in thickness and then α-NPD is formed 60 nm in thickness. After that, the same mask is used to form bis [2-(2-hydroxyphenyl)benzoxazolate] zinc: Zn(PBO)$_2$ in 10 nm thick as an emitting layer. Then, BCP is formed in 40 nm thick as the electron transporting layer and BCP with Li added is formed in 1 nm thick as the electron injecting layer. It is noted that the structure of the electroluminescent layer is not limited to the laminated structure of the organic compound layer described above.

Among the electroluminescent layers of these colors, CuPc layer and α-NPD layer, which are common to all the colors, can be formed all over the pixel portion. In addition, the mask can be shared among these colors. For example, after forming the red electroluminescent layer, the mask is moved to form the green electroluminescent layer. Then the mask is moved again to form the blue electroluminescent layer. In addition, the order of the electroluminescent layer of each color to be formed may be set appropriately.

In addition, in the case of white light emission, a full color display may be performed by providing a color filter or a color conversion layer separately. The color filter or the color conversion layer may be pasted after providing it to the second substrate.

In order to prevent the light-emitting element from deteriorating due to moisture, oxygen, or the like, a protective film 1217 is provided so as to cover the second electrode of the light-emitting element. In this embodiment mode, the protective film 1217 is formed of the insulating film including silicon nitride or silicon nitride oxide as its main component obtained by a DC sputtering method or an RF sputtering method, or formed of a DLC (Diamond Like Carbon) film including hydrogen.

And as shown in FIGS. 7A and 7B, the second electrode 1216 of the light-emitting element is connected to a connection wiring 1208 through a lead wiring from an opening (contact) provided at the connection region in the insulator 1214. The connection wiring 1208 is connected to a flexible print circuit (FPC) 1209 by anisotropic conductive resin (ACF). And a video signal or a clock signal to be an external input signal is received through the FPC 1209. Although only the FPC is illustrated here, a printed wiring board (PWB) may be provided in this FPC.

The present embodiment mode shows the light-emitting device with the driver integrally formed in which the signal line driver circuit 1200 and the scanning line driver circuit 1201 are formed on the first substrate 1210. However, the signal line driver circuit and the scanning line driver circuit may be formed by IC and they may be connected to a signal line or a scanning line by a SOG method or a TAB method.

When ACF is pasted by pressurizing or heating, attention should be paid so that crack is not generated due to the flexibility of the substrate or the softening by the heating. For example, the substrate having high hardness may be set as a support in the region to be pasted.

In the periphery of the first substrate, there is provided a sealant 1205 with which the first substrate and the second substrate 1204 are pasted, and then they are sealed. It is preferable to use epoxy resin as the sealant 1205.

When the first substrate and the second substrate 1204 are sealed, a space is formed between the second substrate and the protective film 1217. The space is filled with the inert gas, for example nitrogen gas, or the material having high moisture-absorption characteristic is formed in the space in order to prevent the moisture or oxygen from penetrating thereinto. In the present embodiment mode, a light-transmitting resin 1230 having high moisture-absorption characteristic is formed. Since the resin 1230 is light-transmitting, even when the light from the light-emitting element is emitted to the second substrate side, the transmittance does not decrease.

Thus, the light-emitting device having the thin film transistor of high functionality with the crystal grain aligned can be manufactured.

(Embodiment Mode 4)

The present embodiment mode explains a liquid crystal display device, one example of the semiconductor devices having the crystalline semiconductor film.

Figure 8A:
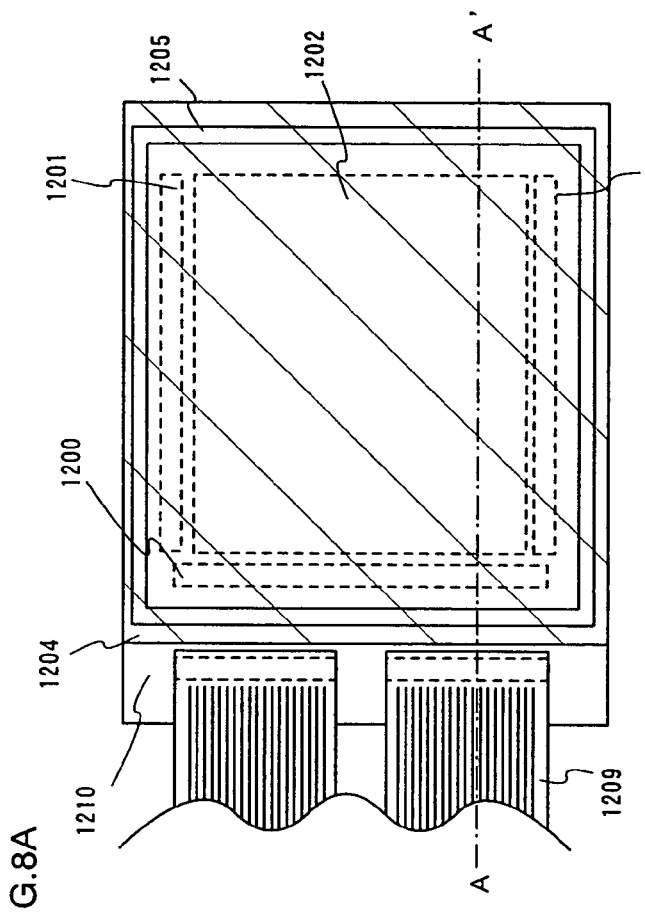
FIGS. 8A and 8B are drawings which show a liquid crystal display device of the present invention.

FIG. 8A shows a liquid crystal display device in which a signal line driver circuit 1200, a scanning line driver circuit 1201, and a pixel portion 1202 are formed on a first substrate 1210.

Figure 8B:
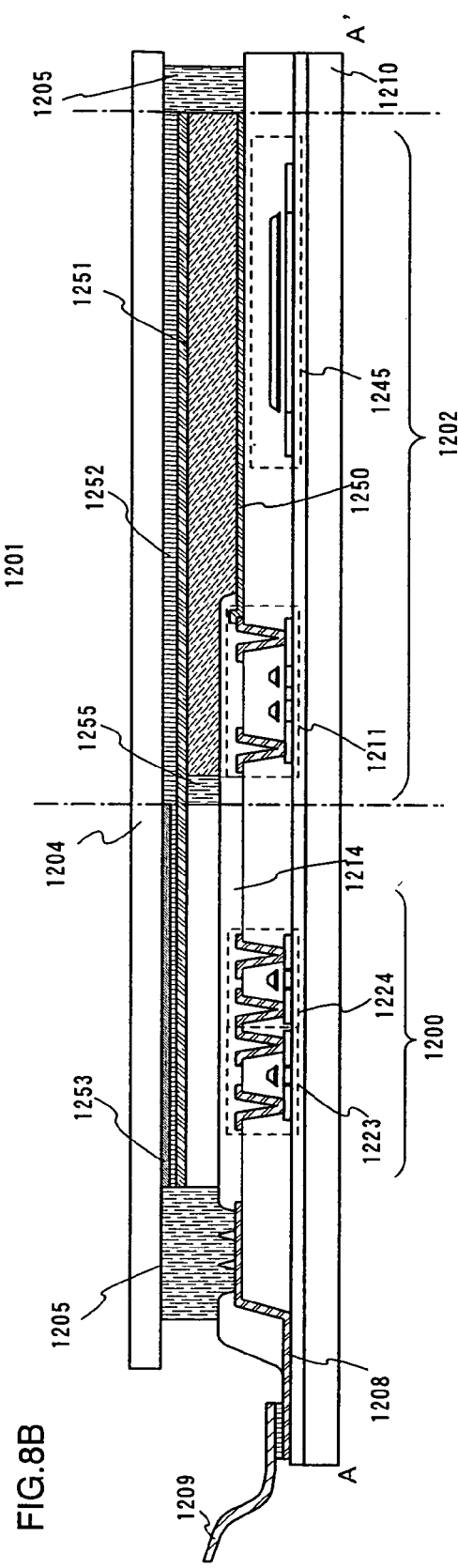

FIG. 8B is a cross-sectional view of the display device taken along A–A' in FIG. 8A, which illustrates the signal line driver circuit 1200 equipped with a CMOS circuit having an n-channel TFT 1223 and a p-channel TFT 1224 on the first substrate 1210. The n-channel TFT 1223 and the p-channel TFT 1224 are formed using the crystalline semiconductor film of high quality obtained by performing the laser annealing with the use of the pulsed laser whose polarization direction is controlled. TFT forming the signal line driver circuit 1200 and the scanning line driver circuit 1201 may be formed by the CMOS circuit, a PMOS circuit, or an NMOS circuit.

The pixel portion 1202 has the switching TFT 1211 and the capacitance element 1245. The switching TFT 1211 is formed using the crystalline semiconductor film of high quality obtained by performing the laser annealing with the use of the pulsed laser whose polarization direction is controlled. The capacitance element 1245 is constituted by the gate insulating film sandwiched between the semiconductor film with the impurity added and the gate electrode. It is noted that TFT of the pixel portion 1202 does not need to have high crystallinity compared to those of the signal line driver circuit 1200 and the scanning line driver circuit 1201. The insulator 1214 having a pixel electrode connected to one electrode of the switching TFT 1211 is provided so as to cover the n-channel TFT 1223, the p-channel TFT 1224, the pixel electrode 1250, and the switching TFT 1211.

In the second substrate 1204 to become an opposing substrate, a black matrix 1253 is provided in the position corresponding to the signal line driver circuit 1200, and a color filter 1252 is provided at least in the position corresponding to the pixel portion. The rubbing treatment is performed to the second substrate 1204 with the opposing electrode 1251 formed, and the first substrate 1210 and the second substrate 1204 are pasted with a spacer 1255 interposed therebetween.

A liquid crystal layer is injected between the first substrate 1210 and the second substrate 1204. It is preferable to inject the liquid crystal layer in the vacuum atmosphere. Alternatively, the liquid crystal layer may be discharged by drops into the first substrate 1210 and then the first substrate 1210 may be pasted with the second substrate 1204. In particular, in the case of using the large substrate, dischraging the liquid crystal layer by drops is more preferable than injecting it.

The first substrate 1210 and the second substrate 1204 are pasted with the use of the sealant 1205. It is preferable to enhance the contrast by providing a polarization plate in the first substrate 1210 and the second substrate 1204 appropriately.

As above, a liquid crystal display device having a sophisticated thin film transistor with the crystal grain formed in a grid pattern can be manufactured.

(Embodiment Mode 5)

The present embodiment mode explains examples of the electronic instruments manufactured by applying the present invention, and there are a digital camera, a sound reproduction device such as a car audio, a note type personal computer, a game machine, a personal digital assistant (a mobile phone, a mobile game machine, and the like), an image reproduction device with a recording medium equipped such as a home-use game machine, and the like. FIGS. 9A to 9H show the specific examples of these electronic instruments.

Figure 9A:
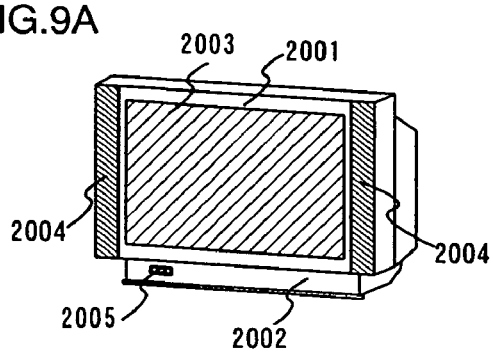
FIGS. 9A to 9H are drawings which show electronic instruments of the present invention.

FIG. 9A shows a display device including a chassis 2001, a supporting stand 2002, a display portion 2003, a speaker portion 2004, a video input terminal 2005, and the like. The display portion 2003 has a light-emitting element or a liquid crystal element, and has a semiconductor film crystallized using a pulsed laser whose polarization direction is controlled.

Figure 9B:
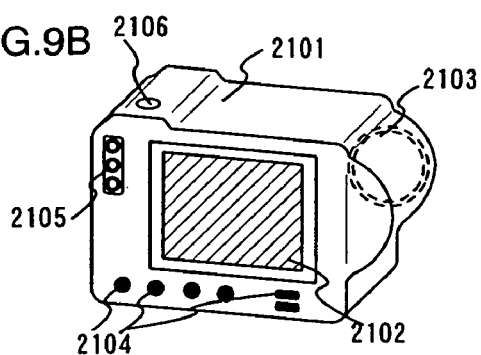

FIG. 9B shows a digital still camera including a main body 2101, a display portion 2102, an image receiving portion 2103, an operation key 2104, an external connection port 2105, a shutter 2106, and the like. The display portion 2102 has a light-emitting element or a liquid crystal element, and has a semiconductor film crystallized using a pulsed laser whose polarization direction is controlled.

Figure 9C:
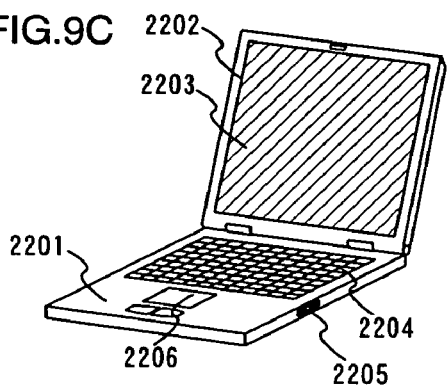

FIG. 9C shows a note type personal computer including a main body 2201, a chassis 2202, a display portion 2203, a key board 2204, an external connection port 2205, a pointing mouse 2206, and the like. The display portion 2203 has a light-emitting element or a liquid crystal element, and has a semiconductor film crystallized using a pulsed laser whose polarization direction is controlled.

Figure 9D:
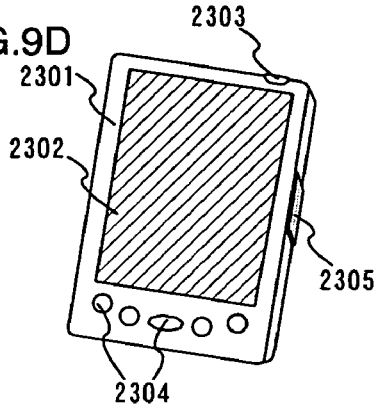

FIG. 9D shows a mobile computer including a main body 2301, a display portion 2302, a switch 2303, an operation key 2304, an infrared port 2305, and the like. The display portion 2302 has a light-emitting element or a liquid crystal element, and has a semiconductor film crystallized using a pulsed laser whose polarization direction is controlled.

Figure 9E:
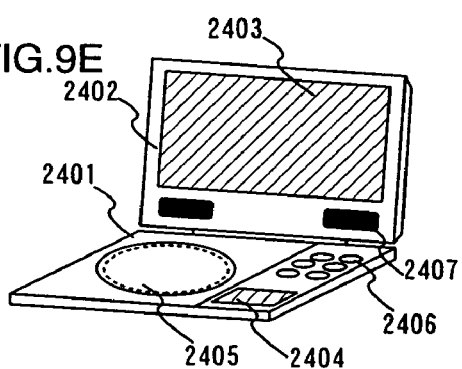

FIG. 9E shows a mobile image reproduction device with a recording medium equipped including a main body 2401, a chassis 2402, a display portion A2403, a display portion B2404, a recording medium reader 2405, an operation key 2406, a speaker portion 2407, and the like. The display portion A2403 mainly displays image information, and the display portion B2404 mainly displays textual information. The display portions A2403 and B2404 have a light-emitting element or a liquid crystal element, and have a semiconductor film crystallized by a pulsed laser whose polarization direction is controlled.

Figure 9F:
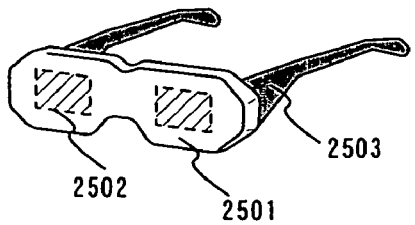

FIG. 9F shows a goggle type display including a main body 2501, a display portion 2502, and an arm portion 2503. The display portion 2502 has a light-emitting element or a liquid crystal element, and has a semiconductor film crystallized using a pulsed laser whose polarization direction is controlled.

Figure 9G:
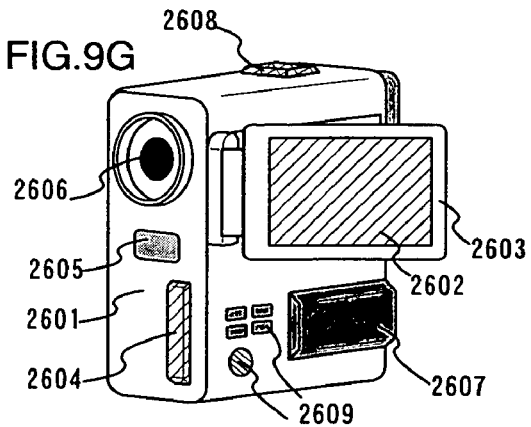

FIG. 9G shows a video camera including a main body 2601, a display portion 2602, a chassis 2603, an external connection port 2604, a remote control receiver 2605, an image receiver 2606, a battery 2607, an audio input portion 2608, an operation key 2609, and the like. The display portion 2602 has a light-emitting element or a liquid crystal element, and has a semiconductor film crystallized using a pulsed laser whose polarization direction is controlled.

Figure 9H:
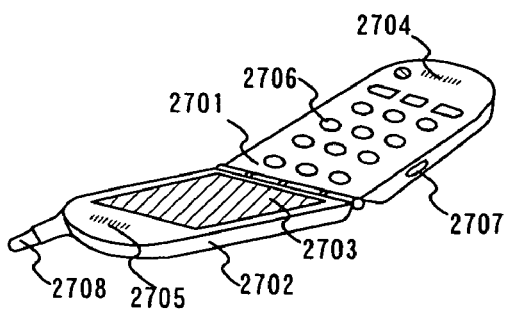

FIG. 9H shows a mobile phone, one of the personal digital assistants, including a main body 2701, a chassis 2702, a display portion 2703, an voice input portion 2704, a voice output portion 2705, an operation key 2706, an external connection port 2707, an antenna 2708, and the like. The display portion 2703 has a light-emitting element or a liquid crystal element, and has a semiconductor film crystallized using a pulsed laser whose polarization direction is controlled.

The electronic instruments described above can be manufactured using the thin film transistor of high functionality according to the present invention.

The present embodiment mode can be freely combined with any one of the above embodiment modes.

Embodiments (Embodiment 1)

This embodiment explains the crystal grain in the crystalline semiconductor film formed by the present invention.

Figure 5:
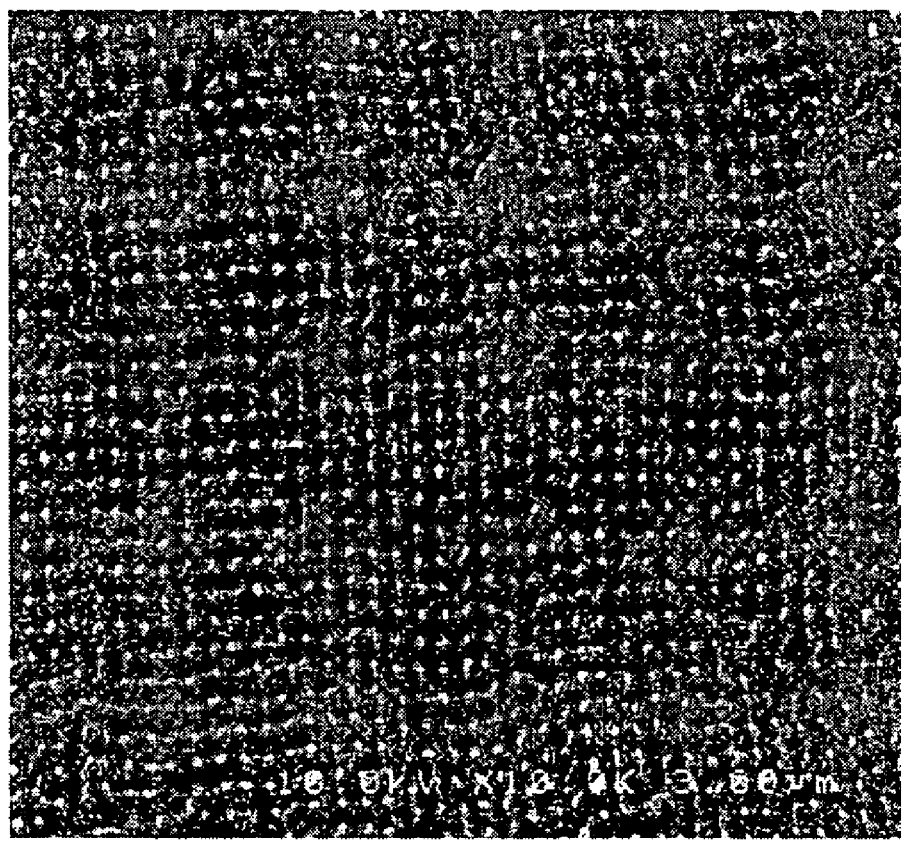
FIG. 5 is a SEM image of a crystalline semiconductor film of the present invention.
Figure 5:
Figure 5:
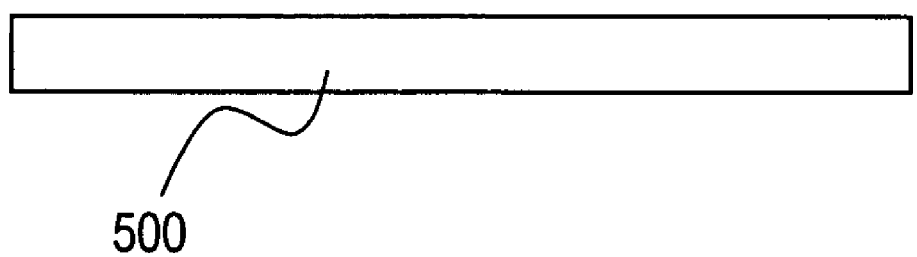

FIG. 5 is a SEM image showing a crystalline silicon film in which the ridge forms a grid pattern. It is noted that an excimer laser is used as the laser and the laser irradiation is performed under the conditions where the energy density is set to 400 mJ/cm$^2$, and the number of shots is set to 25. In addition, in FIG. 5, a pulsed laser beam 500 shaped into linear is scanned in the direction indicated by the arrow relative to the semiconductor film. This direction is referred to as a scanning direction or an irradiating direction of the pulsed laser.

FIG. 5 indicates that the ridge generally forms a grid pattern. In particular, when the ridges arranged in the direction parallel to the arrow are compared to the ridges arranged in the direction perpendicular to the arrow, the ridges are formed in the direction parallel to the arrow more regularly.

Moreover, the ridges form a grid pattern at an interval of 300 nm, which is almost equal to the wavelength of the excimer laser.

Figure 6A:
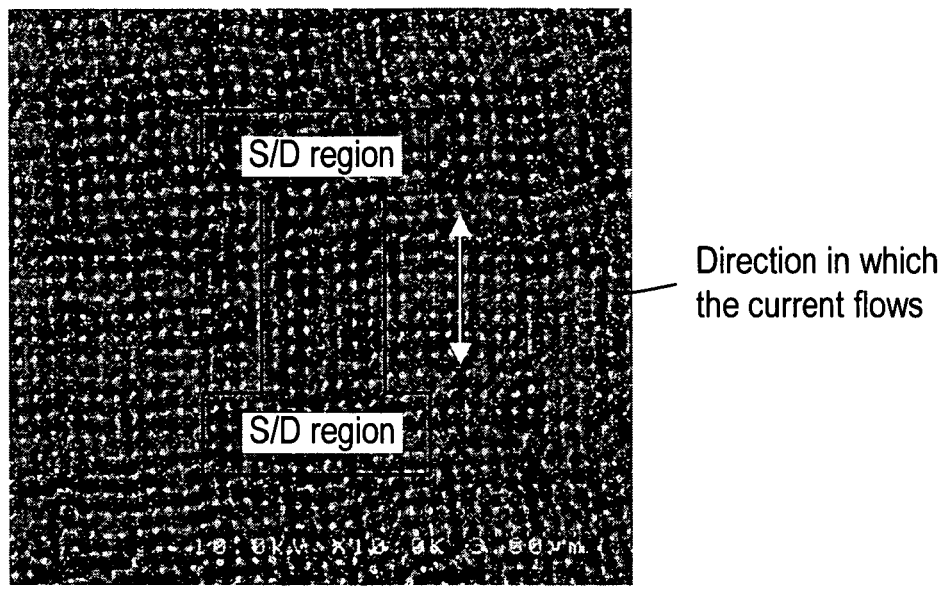
FIGS. 6A and 6B are SEM images which show a position of an island-shaped crystalline semiconductor film of the present invention.
Figure 6B:
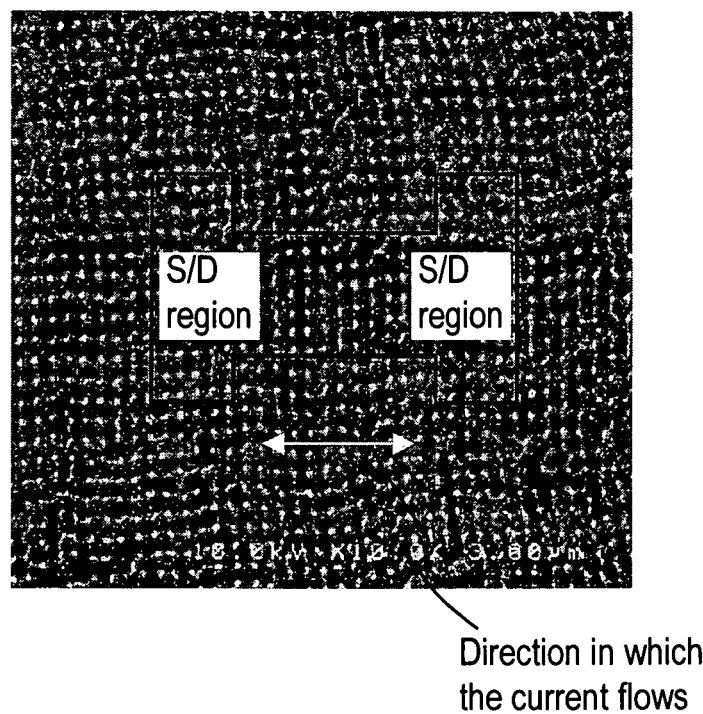

In the case where a thin film transistor is designed in such a crystalline silicon film, a channel-forming region may be provided as shown in FIGS. 6A and 6B. That is to say, it is preferable that the direction in which the current flows is parallel to the direction along the grid pattern of the ridge. Particularly, as shown in FIG. 6A, it is preferable that the current flows along the direction parallel to the arrow in which the ridge is formed more regularly.

(Embodiment 2)

This embodiment explains the principle that the ridge forms a grid pattern with reference to FIGS. 4A to 4E.

Figure 4A:
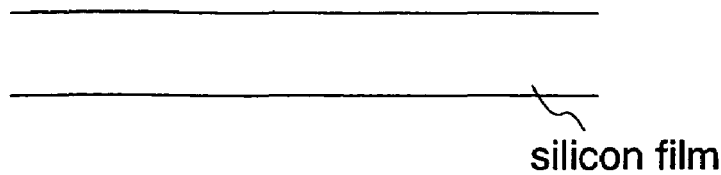
FIGS. 4A to 4E are drawings which show a principle of manufacturing a crystalline semiconductor film according to the present invention.

FIG. 4A shows a silicon film before being irradiated by a pulsed laser.

Figure 4B:
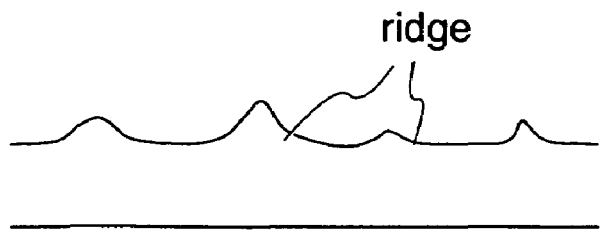

As shown in FIG. 4B, the ridge is formed when the pulsed laser light is irradiated for the first shot. Then, in the case of the silicon film to which the metal element for promoting the crystallization is added and then the heat treatment is performed, the ridge is formed in the position where the crystal grains grown from the nucleus formed in the heat treatment collide lastly. When the heat treatment using the metal element is not performed, the ridge is formed in the random position.

Figure 4C:
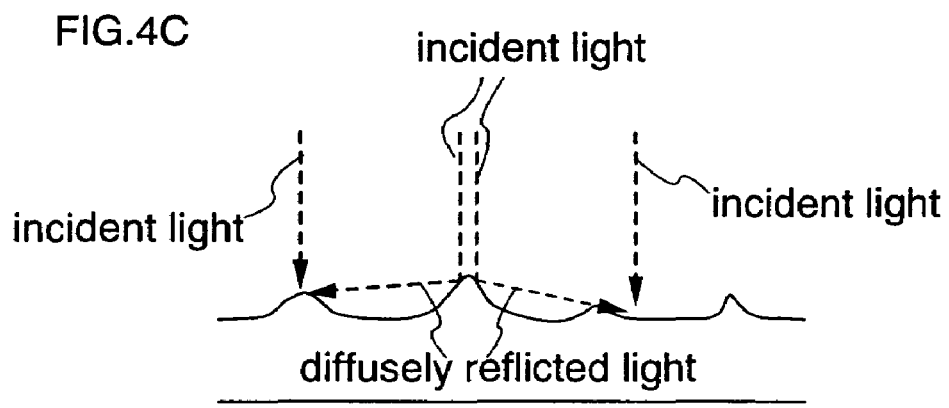

As shown in FIG. 4C, when the pulsed laser light is irradiated for the second shot, scattered light and reflected light (both of them are collectively referred to as diffusely reflected light) increase in the laser irradiation because of the concavity and convexity due to the ridge formed on the surface of the silicon film, which results in the interference between the incident light and the diffusely reflected light.

Figure 4D:
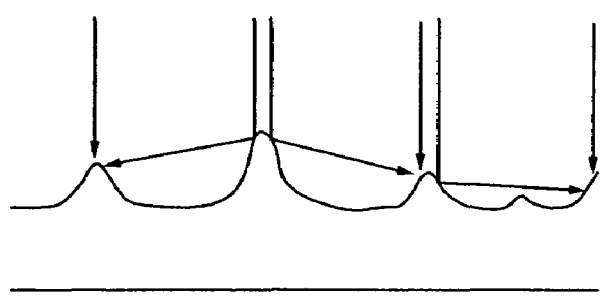
Figure 4E:
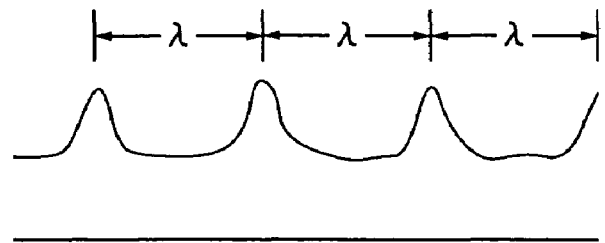

And, as shown in FIG. 4D, when the pulsed laser light is irradiated for the third shot or more, the region where the laser light is reinforced due to the interference is crystallized lastly because the temperature is high. Therefore, the ridge is newly formed in the place where the laser light is reinforced. When the laser light is irradiated further, the ridge produces another diffusely reflected light, which causes the interference in another place.

It is considered that such an interference occurs in all the ridges and the number of ridges increases. And the higher ridge produces the more intense diffusely reflected light. When there are two ridges within the wavelength of the pulsed laser light (for example an excimer laser has a wavelength of approximately 0.3 μm), the higher ridge grows as the number of shots increases, while the lower ridge disappears at the time of melting.

For this reason, even though the ridges are arranged at random initially, the high ridges come to form a grid pattern as the number of shots of pulsed laser light increases. In addition, when the ridges form a grid pattern to some extent, a temperature distribution becomes more remarkable, which promotes the formation of the grid pattern of the ridges.

It is considered that the ridge forms a grid pattern as thus described.

What is claimed is:

1. A method for manufacturing a semiconductor device comprising the steps of:
    adding a metal contain material for promoting crystallization to an amorphous semiconductor film,
    forming a crystalline semiconductor film by heating the amorphous semiconductor film, and
    irradiating the semiconductor film with pulsed laser light whose polarization direction is controlled so as to form a grid pattern of ridges having a grid interval almost equal to an emission wavelength of the pulsed laser light on a surface of the crystalline semiconductor film.

2. A method for manufacturing a semiconductor device comprising the steps of:
    adding a metal contain material for promoting crystallization to an amorphous semiconductor film,
    forming a crystalline semiconductor film by heating the amorphous semiconductor film, and
    once irradiating the semiconductor film with pulsed laser light whose polarization direction is controlled so as to form a grid pattern of ridges having a grid interval almost equal to an emission wavelength of the pulsed laser light on a surface of the crystalline semiconductor film.

3. A method for manufacturing a semiconductor device according to claim 1,
    wherein the metal element is segregated in the ridge.

4. A method for manufacturing a semiconductor device according to claim 2,
    wherein the metal element is segregated in the ridge.

5. A method for manufacturing a semiconductor device according to claim 1,
    wherein the pulsed laser light is scanned in a direction along the grid pattern of the ridge.

6. A method for manufacturing a semiconductor device according to claim 2,
    wherein the pulsed laser light is scanned in a direction along the grid pattern of the ridge.

7. A method for manufacturing a semiconductor device according to claim 1,
    wherein the pulsed laser light has a linear shape.

8. A method far manufacturing a semiconductor device according to claim 2,
    wherein the pulsed laser light has a linear shape.

9. A method for manufacturing a semiconductor device according to claim 1,
    wherein the pulsed laser light is emitted from one or plural lasers selected from the group consisting of an Ar laser, a Kr laser, an excimer laser, a $CO_2$ laser, a YAG laser, a $Y_2O_3$ laser, a $YVO_4$ laser, a YLF laser, a $YAlO_3$ laser, a glass laser, a ruby laser, an alexandrite laser, a Ti:sapphire laser, a copper vapor laser, and a gold vapor laser.

10. A method for manufacturing a semiconductor device according to claim 2,
    wherein the pulsed laser light is emitted from one or plural lasers selected from the group consisting of an Ar laser, a Kr laser, an excimer laser, a $CO_2$ laser, a YAG laser, a $Y_2O_3$ laser, a $YVO_4$ laser, a YLF laser, a $YAlO_3$ laser, a glass laser, a ruby laser, an alexandrite laser, a Ti:sapphire laser, a copper vapor laser, and a gold vapor laser.

11. A method for manufacturing a semiconductor device according to claim 1,
    wherein the metal containing material for promoting the crystallization comprises a metal selected from the group consisting of Ni, Fe, Co, Pd, Pt, Cu, Au, Ag, In, and Sn.

12. A method for manufacturing a semiconductor device according to claim 2,
    wherein the metal containing material for promoting the crystallization comprises a metal selected from the group consisting of Ni, Fe, Co, Pd, Pt, Cu, Au, Ag, In, and Sn.

13. A method for manufacturing a semiconductor device according to claim 1,
    wherein a solution including the metal element for promoting the crystallization is applied to the amorphous semiconductor film by a spin coat method, a dip method, an ion implantation method, or a sputtering method.

14. A method for manufacturing a semiconductor device according to claim 2,
    wherein a solution including the metal element for promoting the crystallization is applied to the amorphous semiconductor film by a spin coat method, a dip method, an ion implantation method, or a sputtering method.

15. The method according to claim 1 further comprising steps of:

patterning the crystalline semiconductor film after the irradiation of the pulsed laser, and forming a source region and a drain region in the patterned crystalline semiconductor film, wherein the crystalline semiconductor film is patterned in such a way that a direction in which a ridge is arranged in the crystalline semiconductor film conforms to a direction in which a current flows through the source region and the drain region.

16. The method according to claim 2 further comprising steps of:

patterning the crystalline semiconductor film after the irradiation of the pulsed laser, and forming a source region and a drain region in the patterned crystalline semiconductor film, wherein the crystalline semiconductor film is patterned in such a way that a direction in which a ridge is arranged in the crystalline semiconductor film conforms to a direction in which a current flows through the source region and the drain region.

17. The method according to claim 1, wherein the pulsed laser light whose polarization direction is controlled by a half-wave plate.

18. The method according to claim 2, wherein the pulsed laser light whose polarization direction is controlled by a half-wave plate.

19. The method according to claim 1, wherein the pulsed laser light whose polarization direction is controlled by a plurality of mirrors.

20. The method according to claim 2, wherein the pulsed laser light whose polarization direction is controlled by a plurality of mirrors.

* * * * *